United States Patent
Ahn

(10) Patent No.: US 9,790,618 B2
(45) Date of Patent: Oct. 17, 2017

(54) METHOD AND APPARATUS FOR GROWING SAPPHIRE SINGLE CRYSTALS

(75) Inventor: Jun Tae Ahn, Seoul (KR)

(73) Assignee: CRISTECH CO., LTD., Gyeonggi-Do (KR)

(*) Notice: Subject to any disclaimer, the term of this patent is extended or adjusted under 35 U.S.C. 154(b) by 1222 days.

(21) Appl. No.: 13/394,031

(22) PCT Filed: Aug. 26, 2010

(86) PCT No.: PCT/KR2010/005731
§ 371 (c)(1),
(2), (4) Date: Mar. 29, 2012

(87) PCT Pub. No.: WO2011/027992
PCT Pub. Date: Mar. 10, 2011

(65) Prior Publication Data
US 2012/0174857 A1    Jul. 12, 2012

(30) Foreign Application Priority Data
Sep. 5, 2009    (KR) .......................... 10-2009-0083722

(51) Int. Cl.
*C30B 29/20* (2006.01)
*C30B 11/00* (2006.01)
(Continued)

(52) U.S. Cl.
CPC .............. *C30B 29/20* (2013.01); *C30B 11/00* (2013.01); *C30B 11/002* (2013.01);
(Continued)

(58) Field of Classification Search
CPC combination set(s) only.
See application file for complete search history.

(56) References Cited

U.S. PATENT DOCUMENTS

| | | | | |
|---|---|---|---|---|
| 5,116,456 A | * | 5/1992 | Nestor | ............................ 117/83 |
| 2003/0172870 A1 | | 9/2003 | Liu et al. | |
| 2008/0257254 A1 | | 10/2008 | Linke et al. | |

FOREIGN PATENT DOCUMENTS

| CN | 1485467 A | 3/2004 |
|---|---|---|
| JP | 2005519837 A | 7/2005 |

(Continued)

OTHER PUBLICATIONS

Chinese Office Action for Application No. 201080049968.3 dated May 29, 2014.

(Continued)

*Primary Examiner* — Duy Deo
*Assistant Examiner* — Erin Bergner
(74) *Attorney, Agent, or Firm* — Tristan A. Fuierer; Moore & Van Allen, PLLC

(57) ABSTRACT

The present invention relates to a method and apparatus for growing sapphire single crystals, and more particularly to a method and apparatus for growing sapphire single crystals in which a high quality, long single crystal can be obtained within a short period of time upon the use of a long rectangular crucible and a long seed crystal extending in a c-axial direction. Use of the method and apparatus for growing sapphire single crystals according to the present invention can uniformly maintain the horizontal temperature at the inside of the crucible despite the use of a rectangular crucible, thereby obtaining a high-quality single crystal as well decreasing the possibility of a failure in the growth of the single crystal.

8 Claims, 3 Drawing Sheets

(51) Int. Cl.
*C30B 15/00* (2006.01)
*C30B 17/00* (2006.01)

(52) U.S. Cl.
CPC ............ *C30B 11/003* (2013.01); *C30B 15/00* (2013.01); *C30B 17/00* (2013.01); *Y10T 117/1092* (2015.01)

(56) References Cited

FOREIGN PATENT DOCUMENTS

| | | | |
|---|---|---|---|
| JP | 2008007353 | A | 1/2008 |
| KR | 1020010017991 | A | 3/2001 |
| KR | 1020020056247 | A | 7/2002 |
| KR | 1020050057815 | A | 6/2005 |

OTHER PUBLICATIONS

Search Report, May 30, 2011.
Korean Office Action, Jun. 25, 2012.
Korean Office Action, English Translation, Aug. 21, 2012.

\* cited by examiner

Czochralski method
maximum yield of 30%

Kyropoulos method
maximum yield of 32-34%

Heat exchange method
yield of about 70%

METHOD AND APPARATUS FOR GROWING SAPPHIRE SINGLE CRYSTALS

CROSS-REFERENCE TO RELATED APPLICATIONS

This application is filed under the provisions of 35 U.S.C. §371 and claims the priority of International Patent Application No. PCT/KR2010/005731 filed on 26 Aug. 2010 entitled "Method and Apparatus for Growing Sapphire Single Crystals" in the name of Jun Tae AHN, which claims priority of Korean Patent Application No. 10-2009-0083722 filed on 5 Sep. 2009, both of which are hereby incorporated by reference herein in their entirety.

TECHNICAL FIELD

The present invention relates to a method and apparatus for growing sapphire single crystals, and more particularly to a method and apparatus for growing sapphire single crystals in which a high quality, long single crystal can be obtained within a short period of time upon the use of a long rectangular crucible and a long seed crystal extending in a c-axial direction.

BACKGROUND ART

GaN semiconductor is used in order to manufacture a blue or white LED invented currently. A GaN single crystal wafer is basically needed as a substrate to grow a GaN semiconductor using a CVD method. However, the GaN single crystal is difficult to grow, a GaN single crystal growth method, which can be put into practical use, has not been developed yet.

Meanwhile, Japanese Nakamura has produced a blue LED by growing a GaN single crystal on a sapphire wafer, and has succeeded in putting the blue LED into practical use. Many crystallographers have made efforts to grow the GaN single crystal for past 20 years or so, but have failed in the development of a grow method having an economical efficiency. Thus, it is naturally recognized that a sapphire ($Al_2O_3$) single crystal wafer should be used to fabricate a blue or white LED, and the demand for the sapphire single crystal wafer is explosively increasing.

A sapphire single crystal can be grown by various growth methods such as a Berneuil process, a hydrothermal process, a Czochralski process, a heat exchange method, a Kyropoulos method, an EFG process, etc. But, among them, a method suitable for growth of a sapphire single crystal having the quality and size enough to be used as a substrate for LEDs can include the heat exchange method and the Kyropoulos method. In addition, a c-plane sapphire wafer is used to fabricate the LEDs. It is preferable to manufacture a sapphire having a long cylindrical shape along a c-axis in terms of a yield in order to manufacture the c-plane sapphire wafer.

The Czochralski process is desirable for growth of a cylindrical single crystal. However, since the sapphire single crystal is difficult to grow in a c-axial direction, an ingot grown by the Czochralski process is mainly grown in an a-axis and is core-drilled vertically to form a cylindrical shape in a c-axis as shown in FIG. 1a. Then, the cored cylindrical ingot is sliced to produce a wafer, thereby resulting in a considerable decrease in a yield (up to a maximum of 30%).

Therefore, the Kyropoulos method is applied which can obtain an ingot having a short thick cylindrical shape rather than an elongated cylindrical shape in order to improve a yield. Also, it is regarded that the quality of crystals grown by this method is superior to that of crystals grown by the Czochralski method. However, as the diameter of the sapphire wafer is currently increased, for example, from 2 inch to 4 inch, a yield of the single crystal grown by this Kyropoulos method is no more than 32% or so. Moreover, there occurs a problem in that if a larger wafer is used, the Kyropoulos method is difficult to apply.

As an original patent related with the growth of a sapphire single crystal using a heat exchanger method, U.S. Pat. No. 3,898,051 (issued on Aug. 5, 1975) discloses that a short cylindrical crystal grown as shown in FIG. 1b, it has a yield (32-34%) similar to that in the Kyropoulos method. But it is known that when a square crucible is used as shown in FIG. 1c, a yield (about 70%) of the crystal can be improved greatly. However, there may occur a problem in that if the shape of the crucible is changed into a long shape such as a rectangular shape, it is not easy to uniformly maintain the internal temperature of the crucible. The reason for this is because in the case where a heater is surroundingly installed around the outer wall of the crucible, the crucible is the lowest in temperature at the center thereof and is gradually increases in the temperature toward the edge of the crucible from the center of the crucible. In other words, a seed crystal has a higher temperature at both ends thereof than at the central portion thereof.

In order to address and solve the above problem, Korean Patent Registration No. 0428699 (Application No. 10-2001-0011553) proposes a method which can provide a desired vertical and horizontal gradient freezing (VHGF) by using a long crucible and varying the width and thickness of a heater. However, in case of employing a long rod-like seed crystal, there is caused a problem in that the temperature according to the length of the seed crystal cannot be uniformly maintained. In particular, if the length of the crucible increases, it will be further difficult to uniformly maintain the temperature in the horizontal direction of the crucible including the temperature of both ends and central portion of the crucible. In addition, there is caused a problem in that since the state of an insulator is changed depending on the use frequency and the use period at a temperature of more than 2000° C., although the internal temperature of the crucible is uniformly maintained by adjusting the width and thickness of the heater, it is changed along with an increase in the use period and use frequency. In this manner, if the temperature in the horizontal direction of the crucible is not uniformly maintained, particularly, in case of using a long rod-like seed crystal, the seed crystal placed at the central bottom of the crucible may melt depending on a position in a longitudinal direction of the crucible or a raw material charged into the crucible may not be melted. If such a phenomenon occurs, a single crystal cannot be grown. Also, the seed crystal is not completely melted and does not have a uniform shape, thereby deteriorating the quality of the grown crystal.

Thus, the prevent inventors have found that (1) in the case where a plurality of heaters dividedly disposed at the outer side of a crucible is independently operated, the horizontal temperature at the inside of the crucible can be uniformly maintained, that (2) in the case where a heater including a lateral heating element and a connecting heating element is used, a vertical temperature gradient can be obtained and the number of electrodes can be reduced, that (3) in the case where the bottom of the crucible is formed concavely inwardly or convexly outwardly, the non-melting of a sapphire scrap or the complete melting of the seed crystal can be prevented, and that (4) in the case where an annealing step is performed after the completion of the crystal growth, the quality of a single crystal can be improved, thereby completing the present invention.

SUMMARY OF INVENTION

It is an object of the present invention to provide a method and apparatus for growing sapphire single crystals in which a high-quality, long single crystal can be obtained in a c-axial direction within a short period of time using a long rectangular crucible.

Another object of the present invention is to provide a method and apparatus for growing sapphire single crystals, in which a vertical temperature gradient can be easily obtained as well as the number of electrodes can be reduced.

Yet another of the present invention is to provide a method and apparatus for growing sapphire single crystals in which the horizontal temperature at the inside of a crucible can be uniformly maintained as well as in which although the internal temperature of the crucible is somewhat not uniformly maintained, a high-quality single crystal can be obtained.

In order to accomplish the above objects, the present invention provides an apparatus for growing a sapphire single crystal, including: a furnace configured to be heated and thermally insulated from the surrounding air so as to cause the internal temperature of the furnace to rise up to more than a melting temperature of a sapphire scrap; a crucible disposed within the furnace so as to allow the sapphire scrap to be melted therein and allow a single crystal to be grown long from a seed crystal therein; a heater disposed at the outside of the crucible so as to melt the sapphire scrap; and cooling means disposed at the bottom of the crucible so as to prevent the seed crystal from being completely melted, wherein the heater is disposed at the outside of the crucible in such a fashion as to be arranged dividedly in plural numbers so as to uniformly maintain the horizontal temperature of the crucible, and is operated independently.

Also, the present invention provides a method of growing a sapphire single crystal using the sapphire single crystal growing apparatus, the method including a step of melting a sapphire scrap and growing a single crystal from a seed crystal while adjusting the internal temperature of the crucible with a plurality of heaters disposed at the outside of the crucible.

In addition, the present invention provides an apparatus for growing a sapphire single crystal, including: a furnace configured to be heated and thermally insulated from the surrounding air so as to cause the internal temperature of the furnace to rise up to more than a melting temperature of a sapphire scrap; a crucible disposed within the furnace so as to allow the sapphire scrap to be melted therein and allow a single crystal to be grown long from a seed crystal therein; a heater disposed at the outside of the crucible so as to melt the sapphire scrap; and cooling means disposed at the bottom of the crucible so as to prevent the seed crystal from being completely melted, wherein the bottom of the crucible on which the seed crystal is placed is formed concavely inwardly or convexly outwardly so as to prevent the non-melting of the sapphire scrap or the complete melting of the seed crystal.

Moreover, the present invention provides a method of growing a sapphire single crystal using the sapphire single crystal growing apparatus, the method including a step of melting sapphire scrap and growing a single crystal from a seed crystal.

Besides, the present invention provides an apparatus for growing a sapphire single crystal, including: a furnace configured to be heated and thermally insulated from the surrounding air so as to cause the internal temperature of the furnace to rise up to more than a melting temperature of a sapphire scrap; a crucible disposed within the furnace so as to allow the sapphire scrap to be melted therein and allow a single crystal to be grown long from a seed crystal therein; a heater disposed at the outside of the crucible so as to melt the sapphire scrap; and cooling means disposed at the bottom of the crucible so as to prevent the seed crystal from being completely melted, wherein the heater comprises a pair of lateral heating elements which are disposed at both sides of the crucible in such a fashion as to be adjacent to the outer wall of the crucible and each of which is connected to each electrode, and a connecting heating element disposed on the tops of the lateral heating elements for interconnecting the pair of lateral heating elements so as to obtain a vertical temperature gradient and reduce the number of electrodes.

Further, the present invention provides a method of growing a sapphire single crystal using the sapphire single crystal growing apparatus, the method including a step of melting a sapphire scrap and growing a single crystal from a seed crystal.

Also, the present invention provides a method for growing a sapphire single crystal, including: a step in which after a seed crystal is placed on the bottom of a crucible and a pulverized sapphire scrap is filled in the crucible, the sapphire scrap is melted to form a liquid melt by raising the internal temperature of the crucible from room temperature up to more than a melting temperature of the sapphire scrap through an electrical resistance heater while cooling the bottom of the crucible using cooling means installed on the underside of the crucible so as to prevent the seed crystal from being completely melted; and a step in which a sapphire single crystal is grown from the seed crystal by gradually dropping the temperature of the heater while cooling the bottom the crucible using the cooling means, wherein the method further includes a step in which annealing is performed by interrupting the cooling process by the cooling means before cooling the crucible to room temperature after the completion of the crystal growth.

BRIEF DESCRIPTION OF THE DRAWINGS

The above and other objects, features and advantages of the present invention will be apparent from the following detailed description of the preferred embodiments of the invention in conjunction with the accompanying drawings, in which.

REFERENCE SIGNS LIST

Figure 1:
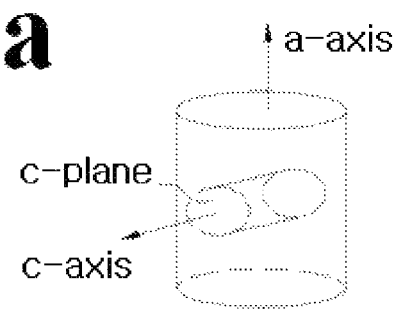
FIGS. 1a to 1c are perspective view illustrating a grown crystal formed according to a method for growing sapphire single crystals according to the prior art.
Figure 1:
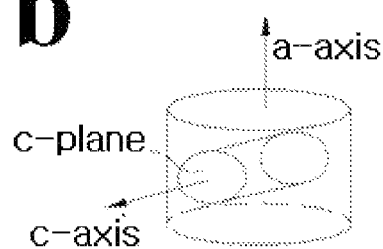
Figure 1:
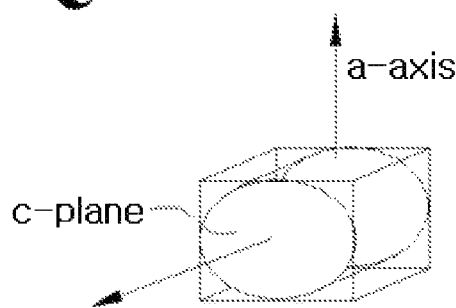

10: furnace
11~16: divided zone 20,21: crucible
21a: protrusion (formed convexly outwardly)
30: heater
31: electrode
32: lateral heating element
33: connecting heating element
40: cooling means
50: melt
51,52: seed crystal

DETAILED DESCRIPTION OF THE INVENTION, AND PREFERRED EMBODIMENTS

Hereinafter, the present invention will be described in detail.

In the present invention, the inventors have tried to find out that when a sapphire single crystal is grown in a rectangular crucible, in the case where a plurality of divided heaters which is controlled independently is used instead of a single heater, the horizontal temperature of the crucible can be uniformly maintained.

In one embodiment of the present invention, a single crystal growing apparatus including six heaters was manufactured and a sapphire single crystal was grown by using the single crystal growing apparatus. As a result, it could be found that the horizontal temperature of the crucible was uniformly maintained during the growth of the sapphire single crystal and a high quality single crystal was be produced.

Thus, in one aspect, the present invention is directed to an apparatus for growing sapphire single crystals, including: a furnace configured to be heated and thermally insulated from the surrounding air so as to cause the internal temperature of the furnace to rise up to more than a melting temperature of a sapphire scrap; a crucible disposed within the furnace so as to allow the sapphire scrap to be melted therein and allow a single crystal to be grown long from a seed crystal therein; a heater disposed at the outside of the crucible so as to melt the sapphire scrap; and cooling means disposed at the bottom of the crucible so as to prevent the seed crystal from being completely melted, wherein the heater is disposed at the outside of the crucible in such a fashion as to be arranged dividedly in plural numbers so as to uniformly maintain the horizontal temperature of the crucible, and is operated independently.

The heaters 30 serve to supply heat to a crucible 20 so as to melt a sapphire scrap filled in the crucible 20. The heater 30 may employ a high melting point metal heater, a graphite heater, and the like by electrical resistance typically used.

The heaters 30 are independently controlled by a temperature sensor, a power control unit, and a temperature control unit, etc.

In the present invention, preferably, the length of each of the divided heater 30 ranges from 5 cm to 25 cm. If the length of each heater is less than 5 cm, the number of the heaters and components controlling the temperature of the heaters increase, thus leading to a complexity of the apparatus and an increase in the manufacturing cost of the apparatus. On the other hand, if the length of each heater exceeds 25 cm, it is difficult to uniformly maintain the horizontal temperature of the crucible. The number of the heaters may vary depending on the length of the crucible.

In other words, in the present invention, it is possible to achieve an effect of dividing the crucible into a plurality of zones in a horizontal direction by disposing a plurality of divided heaters at the outside of the crucible. Also, the temperature sensor, the power control unit, and the temperature control unit are separately installed at each of the divided zones of the crucible to perform the temperature control by feedback so that the horizontal temperature of the crucible can be uniformly maintained regardless of the length of the crucible. Thus, in case of using the apparatus, despite a change in characteristics of the insulator according to the use frequency, the internal temperature of the crucible can be always uniformly obtained. Theoretically, as the number of the divided zones increases, the uniformity of the internal temperature of the crucible is improved. For example, if a crucible having a length of about 30-40 cm has three to six divided zones, a sapphire single crystal of high quality can be grown (see FIG. 2).

The heater 30 comprises a pair of lateral heating elements 32 which are disposed at both sides of the crucible in such a fashion as to be adjacent to the outer wall of the crucible 20 and each of which are connected to each electrode 31, and a connecting heating element 33 disposed on the tops of the lateral heating elements 32 for interconnecting the pair of lateral heating elements 32.

Figure 2:
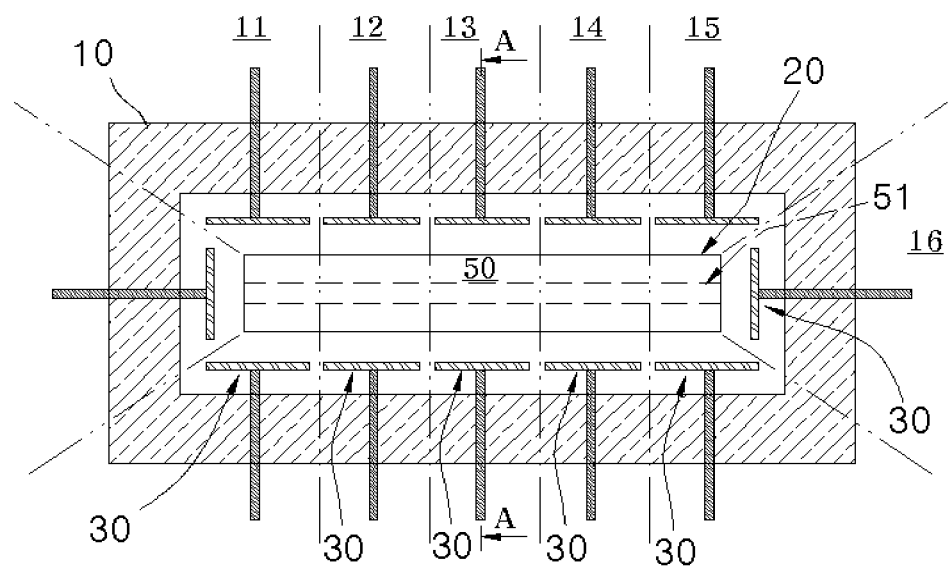
FIG. 2 is a top plan and cross-sectional view illustrating an apparatus for growing sapphire single crystals according to one embodiment of the present invention.
Figure 3:
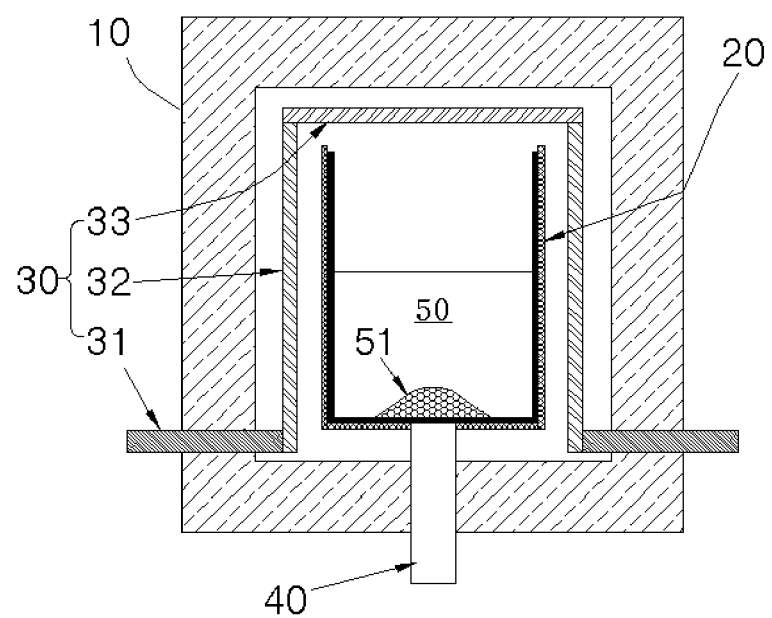
FIG. 3 is a schematic cross-sectional view taken along the line A-A of FIG. 2.

As shown in FIG. 3, the heater 30 of the sapphire single crystal growing apparatus according to one embodiment of the present invention comprises a pair of lateral heating elements 32 which are disposed at both sides of the crucible in such a fashion as to be adjacent to the outer wall of the crucible 20 and each of which are connected to each electrode 31, and a connecting heating element 33 disposed on the tops of the lateral heating elements 32 for interconnecting the pair of lateral heating elements 32. In this manner, the heater 30 is constructed so that a vertical temperature gradient can be easily obtained as well as the number of the electrodes can be reduced despite the adoption of a plurality of heaters 30, thereby simplifying the construction of the entire apparatus and manufacturing the apparatus in an expensive manner. In FIG. 2, the heater 30 of a divided zone 16 corresponding to both ends of the crucible may be connected with each other through the bottom of the crucible. Also, the vertical temperature gradient can be controlled depending on a cooling and insulating structure of the bottom of the crucible.

In the present invention, the crucible serves to allow a sapphire scrap to be melted therein and allow a single crystal to be grown from a seed crystal therein. The crucible may employ a molybdenum material or the like which is not melted even at high temperature. The bottom of the crucible on which the seed crystal is placed is preferably formed concavely inwardly or convexly outwardly so as to prevent the non-melting of the sapphire scrap or the complete melting of the seed crystal.

In another aspect, the present invention is directed to a method of growing sapphire single crystals using the apparatus, the method including a step of melting a sapphire scrap and growing a single crystal from a seed crystal while adjusting the internal temperature of the crucible with a plurality of heaters disposed at the outside of the crucible.

The sapphire single crystal growth method according to the present invention includes a step of melting a sapphire scrap, and a step of growing a single crystal from the seed crystal 51 as a conventional technique.

That is, in the step of melting the sapphire scrap, a long seed crystal 51 extending along a c-axial direction is disposed on the bottom of a long rectangular crucible 20 extending in a horizontal direction in the furnace 10, and a pulverized sapphire scrap is filled in the crucible 20. Thereafter, the sapphire scrap is melted to form a liquid melt by raising the internal temperature of the crucible from room temperature up to more than a melting temperature of the sapphire scrap through an electrical resistance heater while cooling the bottom of the crucible using cooling means 40 installed on the underside of the crucible so as to prevent the seed crystal from being completely melted.

In this manner, after the sapphire scrap is thoroughly melted, in the step of growing the single crystal from the seed crystal 51, a sapphire single crystal is grown from the seed crystal by gradually dropping the temperature of the heater 30 while cooling the bottom the crucible using the cooling means 40 installed on the underside of the crucible 20.

In the above step of melting the sapphire scrap and growing the single crystal, the supply of power to the heater 30 is controlled by a controller so that the temperature of each of the divided zones 11 to 16 is uniformly maintained which is obtained from a temperature sensor (not shown) installed at each of the divided zones 11 to 16.

In this manner, the horizontal temperature at the inside of the crucible 20 is uniformly maintained so that the quality of the grown crystal is excellent, particularly, the quality of the grown crystal is maintained irrespective of a change in the characteristics of the insulator.

The above sapphire single crystal growth method according to the present invention may further include a step in which annealing is performed by interrupting the cooling process by the cooling means before cooling the crucible to room temperature after the completion of the crystal growth.

In the meantime, in the present invention, it could be found that in the case where the heater includes a pair of opposed lateral heating elements disposed at the left and right sides of the crucible and a connecting heating element for interconnecting the pair of opposed lateral heating elements, a vertical temperature gradient can be obtained within the crucible, and a heat loss by the electrodes can be suppressed through a reduction in the number of the electrodes.

Therefore, the present invention is directed to an apparatus for growing sapphire single crystals, including: a furnace configured to be heated and thermally insulated from the surrounding air so as to cause the internal temperature of the furnace to rise up to more than a melting temperature of a sapphire scrap; a crucible disposed within the furnace so as to allow the sapphire scrap to be melted therein and allow a single crystal to be grown from a seed crystal therein; a heater disposed at the outside of the crucible so as to melt the sapphire scrap; and cooling means disposed at the bottom of the crucible so as to prevent the seed crystal from being completely melted, wherein the heater wherein the heater comprises a pair of lateral heating elements which are disposed at both sides of the crucible in such a fashion as to be adjacent to the outer wall of the crucible and each of which is connected to each electrode, and a connecting heating element disposed on the tops of the lateral heating elements for interconnecting the pair of lateral heating elements so as to obtain a vertical temperature gradient and reduce the number of electrodes.

The sapphire single crystal growth apparatus can secure the uniformity of the horizontal temperature of the crucible by adjusting the width and thickness of the heater. As mentioned above, the bottom of the crucible on which the seed crystal is placed is preferably formed concavely inwardly or convexly outwardly so as to prevent the non-melting of the sapphire scrap and the complete melting of the seed crystal.

In yet another aspect, the present invention is directed to a method for growing sapphire single crystals using the sapphire single crystal growth apparatus, the method including a step of melting a sapphire scrap and growing a single crystal from a seed crystal. Meanwhile, in one embodiment of the present invention, it could be found that when a crucible whose bottom is formed concavely inwardly or convexly outwardly is used instead of a rectangular crucible, the cooling surface of the grown crystal bottom is increased, thereby improving the quality of the single crystal as well as decreasing the possibility of a failure in the growth of the single crystal.

Thus, in still another aspect, the present invention is directed to an apparatus for growing sapphire single crystals, including: a furnace configured to be heated and thermally insulated from the surrounding air so as to cause the internal temperature of the furnace to rise up to more than a melting temperature of a sapphire scrap; a crucible disposed within the furnace so as to allow the sapphire scrap to be melted therein and allow a single crystal to be grown long from a seed crystal therein; a heater disposed at the outside of the crucible so as to melt the sapphire scrap; and cooling means disposed at the bottom of the crucible so as to prevent the seed crystal from being completely melted, wherein the bottom of the crucible on which the seed crystal is placed is formed concavely inwardly or convexly outwardly so as to prevent the non-melting of the sapphire scrap or the complete melting of the seed crystal.

Figure 4:
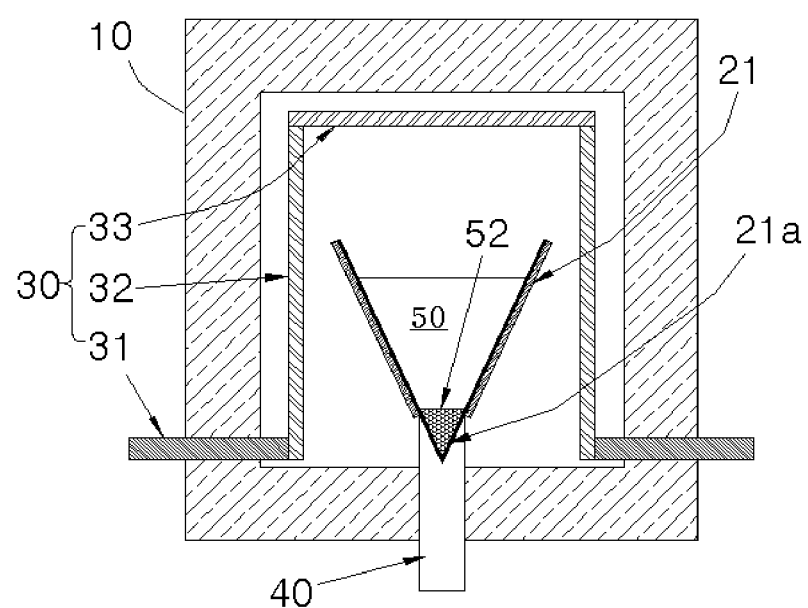
FIG. 4 is a schematic cross-sectional view illustrating an apparatus for growing sapphire single crystals according to another embodiment of the present invention.

In the present invention, in the case where the bottom of the crucible on which the seed crystal is placed has a W or V cross-sectional shape so as to be formed concavely inwardly or convexly outwardly as shown in FIG. 4.

In the case where the bottom of the crucible is formed concavely inwardly or convexly outwardly, the cooling surface of the grown crystal bottom is increased to increase a temperature difference between the top and the bottom of the seed crystal, so that the non-melting of the sapphire scrap as a material positioned above the seed crystal or the complete melting of the seed crystal can be prevented despite the non-uniformity of the horizontal temperature of the crucible or the setting of the temperature of the crucible which is somewhat improper.

In other words, in case of using the sapphire single crystal growth apparatus, since the bottom of the crucible has a sharp wedge shape despite the non-uniformity of the horizontal temperature of the crucible, the crucible can be sufficiently cooling by a cold plate disposed below the bottom thereof. Thus, the apparatus of the present invention has an effect in which the complete melting of the seed crystal or the non-melting of the material charged into the crucible can be reduced. Also, since the top of the crucible is widened, the material is easily charged into the crucible.

The heater of the sapphire single crystal growth apparatus consists of a plurality of divided heaters as described above. Also, the heater preferably includes a plurality of lateral heating elements and a connecting heating element for interconnecting the lateral heating elements.

In a further aspect, the present invention is directed to a method for growing sapphire single crystals using the sapphire single crystal growth apparatus, the method including a step of melting a sapphire scrap and growing a single crystal from a seed crystal.

Lastly, in the present invention, it could be found that in the case where annealing is performed before cooling the crucible to room temperature after the completion of the crystal growth, the quality of the single crystal can be improved by alleviating a stress inside the grown crystal by a temperature gradient in the crucible and the grown crystal. Therefore, in still further aspect, the present invention is directed to a method for growing sapphire single crystals, including: a step in which after a seed crystal is placed on the bottom of a crucible and a pulverized sapphire scrap is filled in the crucible, the sapphire scrap is melted to form a liquid melt by raising the internal temperature of the crucible from room temperature up to more than a melting temperature of the sapphire scrap through an electrical resistance heater while cooling the bottom of the crucible using cooling means installed on the underside of the crucible so as to prevent the seed crystal from being completely melted; and a step in which a sapphire single crystal is grown from the seed crystal by gradually dropping the temperature of the heater while cooling the bottom the crucible using the cooling means, wherein the method further includes a step in which annealing is performed by interrupting the cooling process by the cooling means and uniformly maintaining the internal temperature of the crucible before cooling the crucible to room temperature after the completion of the crystal growth.

The annealing step is performed while maintaining the internal temperature of the crucible at a temperature ranging from 1700° C. to 2000° C. for 1-50 hours.

Typically, the sapphire scrap is melted at a temperature of more than 2100° C., and the single crystal is grown at a temperature ranging from about 1920° C. to 2100° C. That is, since the melting temperature of the sapphire is 2045° C., a melting start temperature and a crystal growth temperature should be 2045° C. But since there may be a difference between a temperature measuring position and a position where the single crystal is grown and the material is melted, such a difference in the crystal growth temperature can occur and this temperature difference range may vary by changing the temperature measuring position.

In the present invention, the cooling means serves to lower the temperature of the bottom of the crucible so as to prevent the seed crystal placed on the bottom of the crucible from be completely melted. The cooling means may employ means which is generally used.

The cooling means can be exemplified by a cold plate made of tungsten or molybdenum which can forcibly perform a cooling function using gas or liquid. Thus, in the case where the cooling means is a cold plate, the cooling process is interrupted by separating the cold plate from the crucible by means of the vertical movement of the cold plate or the crucible.

EXAMPLES

Hereinafter, the present invention will be described in further detail with reference to examples. It will be obvious to those skilled in the art that these examples are illustrative purposes only and are not to be construed to limit the scope of the present invention.

In particular, since the other concrete construction and structure of sapphire single crystal growth apparatuses is similar to that of the prior arts which have been previously known, it will be omitted to avoid redundancy and the concrete embodiment of the present invention having the above construction will be described hereinafter. Although a long rectangular crucible is employed in the following embodiment and the accompanying drawings, the present invention is not limited thereto. Also, although only a long seed crystal 52 is employed in a square crucible, a similar result can be obtained. The cross-sectional shape of the crucible is not limited particularly except Example 2.

Example 1

Sapphire Single Crystal Growth Apparatus Including a Plurality of Divided Heaters Specification and used materials of the sapphire single crystal growth apparatus are as follows:
 Material of crucible: Mo (molybdenum)
 Dimension of crucible: 110W*200H*400L (Unit: mm)
 Dimension of seed crystal: 30W*10H*380L (Unit: mm)
 Cold plate(cooling means): Mo 20*360L (Unit: mm)
 Number of divided zones: 6 (including left and right sides)
 Heater (heating element): high-purity isotropic graphite 8t
 Temperature sensor: pyrometer/Measurement point: heater surface
 Temperature control scheme: PID
 Cooling type of cold plate: water cooling.

A sapphire single crystal was grown by using a sapphire single crystal growth apparatus having six zones divided by the heater. First, 19.5 kg of a sapphire scrap was pulverized and was filled in a crucible. Then, the internal temperature of the crucible was raised from room temperature up to 2110° C. for 15 hours and then was maintained for 2 hours. The crystal growth was performed by gradually dropping the temperature of a heater to 1920° C. at a rate of 5° C./hr. Thereafter, the temperature of the heater was gradually dropped to room temperature for 30 hours.

In the melting termination step, i.e., the step immediately before a single crystal is grown, the temperature of the heater (i.e., a central portion of the lateral heating element) was maintained at 2100° C. The temperature of a crucible holder (at the height corresponding to the central portion of the lateral heating element) was measured using a pyrometer by zone along a (longitudinal) horizontal position of the crucible. As a result, it was found that the longitudinal temperature of the crucible holder ranges from 2080° C. to 2085° C., that is, a temperature deviation in the longitudinal temperature of the crucible is less than 5° C. If the deviation in the longitudinal temperature of the crucible holder is larger, there is a possibility of generating a portion where the seed crystal is completely melted. In the meantime, if the deviation in the longitudinal temperature of the crucible holder is about 5° C. or so, there occurred a much smaller temperature deviation on the seed crystal placed on the inner bottom of the crucible disposed on a cold plate. Also, it was found that the internal temperature of the crucible was maintained more uniformly, and hence there was no failure in the growth of a single crystal. In this case, since the temperature measurement is made by the pyrometer and hence the sidewall of the crucible cannot be observed from the outside, the temperature of the crucible holder having the same height as that of the heater was measured.

The thus grown sapphire single crystal had no defects such as air bubbles, cracks or the like. In addition, the grown sapphire single crystal was processed into a wafer to produce a sapphire single crystal wafer and was etched in a KOH solution at 300° C. Then, as a result of the measurement of EPD, there was a difference by zone between the single crystal and the wafer, but the measured EPD exhibited an average of 400 numbers/cm$^2$ or so.

This sapphire single crystal wafer was considered to have a quality (EPD: an average of 400 numbers/cm2) superior to that of a wafer (EPD: an average of 500-1000 numbers/cm$^2$) which is currently being put into commercial use by a conventional technique. It is considered that since there was no horizontal temperature gradient owing to en effect by the uniform control of the horizontal temperature of the crucible, a nearly linear solid-liquid interface was formed. Thus, if the crucible had an aspect ratio of more than 1.5:1 in the conventional prior art, there was a difficulty in the temperature control so that a long seed crystal was difficult to use and a long single crystal could not be grown. On the contrary, it could be found in the present invention that a long seed crystal extending in a c-axial direction was used and the length of the crucible was made large, i.e., the aspect ratio of the crucible was made to be more than 1.5:1 so that a further longer single crystal can be grown in a c-axial direction. Therefore, it is considered that since it was possible to grow a long, high-quality crystal at equal time, productivity per time was greatly improved. In the case where an ingot having an increased size of 100*100*400 mm is produced as compared to current production of an ingot having a size of 100*100*100 mm, the productivity is four times and the cost is no more than 55% of that of the currently produced ingot at equal time, so that a great benefit can incur through a small investment. It is possible to make large the length of the grown crystal. This is the greatest merit of the present invention and there is not limitation in increasing the length of the crystal. From the point of view of reality, it is considered that the ingot preferably has a size of 100*100*400-600 mm or so. If the size of the ingot is larger than 100*100*400-600 mm, its handling will be inconvenient.

Example 2

Sapphire Single Crystal Growth Apparatus Including a Crucible having a V Cross-Sectional Shape Specification and used materials of the sapphire single crystal growth apparatus are as follows:

Material of the crucible: Mo(molybdenum)
Dimension of the crucible: length of each side of equilateral triangle 200*400L (Unit: mm)
Dimension of Seed crystal: 30W*26H*380L (Unit: mm)
Cold plate: Mo 20*360L (Unit: mm, having a groove formed on the top)
Number of divided zones: 6
Heater: high-purity isotropic graphite 8t
Temperature sensor: pyrometer/Measurement point: heater surface
Temperature control scheme: PID
Cooling type of cold plate: water cooling (the cold plate separated from the crucible bottom after the crystal growth)

A sapphire single crystal was grown through addition of an annealing process by using a sapphire single crystal growth apparatus having six zones divided by the heater and including a crucible having a V cross-sectional shape. First, 44.5 kg of a sapphire scrap was pulverized and was filled in the crucible. Then, the internal temperature of the crucible was raised from room temperature up to 2120° C. for 15 hours and then was maintained for 2 hours. The crystal growth was performed by gradually dropping the temperature of a heater to 1920° C. at a rate of 5° C./hr. After the completion of the crystal growth, the cold plate close contact with the underside of the crucible was moved downwardly so as to be separated from the bottom of the crucible. Then, an annealing step was performed while maintaining the temperature of the crucible for 3 hours.

The temperature of a crucible holder was measured using a pyrometer by zone along a (longitudinal) horizontal position of the crucible. As a result, it was found that a temperature deviation in the longitudinal temperature of the crucible is less than 6° C. Also, it was found that the internal temperature of the crucible was maintained more uniformly, and hence there was no failure in the growth of a single crystal.

Through the annealing process by the separation of the cold plate from the bottom of the crucible, the time spent to cool the crystal in the crucible to room temperature could be reduced to 20 hours without generating any crack. When the annealing process is not performed, cracks due to stress in crystals are generated from most of the crystals cooled for 20 hours. The thus grown sapphire single crystal had no defects such as air bubbles, cracks or the like similar to the case of Example 1. In addition, the grown sapphire single crystal was processed into a wafer to produce a sapphire single crystal wafer and was etched in a KOH solution at 300° C. Then, as a result of the measurement of EPD, there was a difference by zone between the single crystal and the wafer, but the measured EPD exhibited an average of 300 numbers/$cm^2$ or so, which showed the quality superior to that of a wafer currently put into commercial use and Example 1.

The construction, operation and conditions which have not been described in detail are similar to those in the previously known prior arts, and thus their concrete description and illustration was omitted.

INDUSTRIAL APPLICABILITY

As described above, according to the present invention, despite the use of a long seed crystal arranged along a c-axis and a change in the state of an insulator depending on the use frequency and the use period, the horizontal temperature of the crucible can be controlled uniformly by dividing the crucible into a plurality of zones in a horizontal direction thereof. Thus, advantageously, the seed crystal can be melted at the top thereof in a uniform shape and a single crystal can be uniformly grown from the seed crystal, thereby obtaining a high-quality single crystal. Furthermore, a much longer crystal may be grown in a c-axial direction by making the length of the crucible large, i.e., making the crucible having an aspect ratio of more than 1.5:1.

In addition, the present invention has an advantageous effect in that the heater includes a pair of opposed lateral heating elements and a connecting heating element for interconnecting the lateral heating elements, so that a vertical temperature gradient can be easily obtained, heat loss by electrodes can be suppressed through a reduction in the number of electrodes, and the entire apparatus can be constructed in an inexpensive manner. Further, annealing is performed after the completion of the crystal growth so that the quality of a grown single crystal can be improved. Also, the bottom of the crucible on which the seed crystal is placed is formed concavely inwardly or convexly outwardly so that the cooling surface of the grown crystal bottom is increased, thereby improving the quality of the single crystal as well as decreasing the possibility of a failure in the growth of the single crystal.

While the present invention has been described in detail with reference to specific features, it will be apparent to those skilled in the art that this description is only for a preferred embodiment and does not limit the scope of the present invention. Thus, the substantial scope of the present invention will be defined by the appended claims and equivalents thereof.

What is claimed is:

1. An apparatus for growing sapphire single crystals, comprising: a furnace surrounding a crucible for heating the crucible, wherein the furnace is thermally insulating from the surrounding air so as to cause an internal temperature of the furnace to rise up to more than a melting temperature of a sapphire scrap; a crucible having a rectangular cross-sectional shape, wherein the crucible has a bottom, a front horizontal wall, a back horizontal wall, and two end walls and a horizontal wall:end wall aspect ratio more than 1.5:1, wherein the crucible can be disposed within the furnace so as to allow the sapphire scrap to be melted therein and allow a single crystal to be grown long from a seed crystal therein; a plurality of heaters disposed at the outside of the crucible, adjacent to the walls of the crucible, so as to melt the sapphire scrap; and cooling means disposed at the bottom of the crucible so as to prevent the seed crystal from being completely melted, wherein the plurality of heaters are disposed along the horizontal walls of the crucible to create three to six horizontal and divided heating zones, wherein each of the divided heating zones are independently controlled so as to uniformly maintain temperature along the horizontal walls of the crucible, and wherein each heating zone comprises (a) a pair of lateral heating elements which are disposed at the front and back horizontal walls of the crucible, wherein each heating element is connected to an electrode and the corresponding heating element, and (b) a connecting heating element for interconnecting each pair of lateral heating elements; and wherein the crucible is arranged to accommodate a seed crystal that can extend in a c-axial direction so that a sapphire single crystal can be grown in the c-axial direction.

2. The apparatus according to claim 1, wherein the length of each divided heating zone ranges from 5 cm to 25 cm.

3. The apparatus according to claim 1, wherein the bottom of the crucible on which the seed crystal is placed is formed concavely inwardly or convexly outwardly so as to prevent the non-melting of the sapphire scrap or the complete melting of the seed crystal.

4. A method of growing sapphire single crystals using the apparatus according to claim 1, the method comprising a step of melting a sapphire scrap and growing a single crystal from a seed crystal while adjusting the internal temperature of the crucible with the plurality of heating elements disposed at the outside of the crucible.

5. The method according to claim 4, further comprising a step in which annealing is performed by interrupting the cooling process by separating the cooling means from the crucible by means of the vertical movement of the cooling means or the crucible and uniformly maintaining the internal temperature of the crucible before cooling the crucible to room temperature after the completion of the crystal growth.

6. The apparatus according to claim 1, wherein the bottom of the crucible has a W or V cross-sectional shape so as to be formed concavely inwardly or convexly outwardly.

7. The apparatus according to claim 1, wherein each divided heating zone further comprises a separate temperature sensor, a separate power control unit, and a separate temperature control unit.

8. The apparatus according to claim 1, further comprising a pair of lateral heating elements positioned at both ends of the crucible, to create a separate heating zone along the width of the crucible.

* * * * *